US010228391B2

United States Patent
Lai et al.

(10) Patent No.: US 10,228,391 B2
(45) Date of Patent: Mar. 12, 2019

(54) TWO-PIECE SPRING PROBE

(71) Applicant: WinWay Tech. Co., Ltd., Kaohsiung (TW)

(72) Inventors: Chyi-Lang Lai, Kaohsiung (TW);
Po-Hong Chen, Kaohsiung (TW);
Chun-Kiu Tan, Kaohsiung (TW);
Chia-Pin Sun, Kaohsiung (TW)

(73) Assignee: WINWAY TECH. CO., LTD., Kaohsiung (TW)

( * ) Notice: Subject to any disclaimer, the term of this patent is extended or adjusted under 35 U.S.C. 154(b) by 533 days.

(21) Appl. No.: 14/993,777

(22) Filed: Jan. 12, 2016

(65) Prior Publication Data
US 2017/0199224 A1 Jul. 13, 2017

(51) Int. Cl.
*G01R 1/067* (2006.01)
(52) U.S. Cl.
CPC .............................. *G01R 1/06722* (2013.01)

(58) Field of Classification Search
CPC ................................................ G01R 1/06722
See application file for complete search history.

(56) References Cited

U.S. PATENT DOCUMENTS

| 6,033,233 A * | 3/2000 | Haseyama ......... G01R 1/06716 439/515 |
| 2005/0280433 A1 * | 12/2005 | Nelson ............... G01R 1/06722 324/755.05 |

* cited by examiner

*Primary Examiner* — Daniel Miller
(74) *Attorney, Agent, or Firm* — Merchant & Gould P.C.

(57) ABSTRACT

A two-piece spring probe in electrical contact with a piece of testing equipment is used for probing an object to be tested. The two-piece spring probe includes a coiled compression spring and a conductive element. The coiled compression spring has a non-uniform outer diameter and is used to electrically contact the object. The conductive element is directly connected to the coiled compression spring and in electrical contact with the testing equipment.

7 Claims, 8 Drawing Sheets

TWO-PIECE SPRING PROBE

FIELD

The disclosure relates to a spring probe, more particularly to a two-piece spring probe.

BACKGROUND

Referring to FIG. 1, a conventional spring probe 1 in electrical contact with a piece of testing equipment (not shown) is used for probing an object (not shown) to be tested. The conventional spring probe 1 includes a first contacting member 11, a second contacting member 12 spaced apart from the first contacting member 11, and a spring 13 including two ends that respectively abut against the first and second contacting members 11, 12. When either one of the first and second contacting members 11, 12 abuts against the object, the spring 13 is compressed and the first and second contacting members 11, 12 move toward each other.

The conventional spring probe 1 has a three-piece configuration. To be more specific, the first and second contacting members 11, 12 must be separately manufactured, followed by assembling the first and second contacting members 11, 12 with the spring 13 so as to obtain the conventional spring probe 1. When the conventional spring probe 1 is relatively small in size, increased manufacturing costs would be incurred due to the difficulty in manufacturing the relatively small first and second contacting members 11, 12. Moreover, assembly of the relatively small first and second contacting members 11, 12 with the spring 13 would be time consuming. In addition, the electrical signal must travel along a relatively lengthy spiral path of the spring 13 when transmitted between the first and second contacting members 11, 12, which may adversely affect probing results of the conventional spring probe 1.

SUMMARY

Therefore, an object of the present disclosure is to provide a two-piece spring probe that can alleviate at least one of the aforementioned drawbacks associated with the conventional spring probe.

According to the disclosure, a two-piece spring probe in electrical contact with a piece of testing equipment is used for probing an object to be tested. The two-piece spring probe includes a coiled compression spring and a conductive element. The coiled compression spring has a non-uniform outer diameter and is used to electrically contact the object. The conductive element is directly connected to the coiled compression spring and in electrical contact with the testing equipment.

BRIEF DESCRIPTION OF THE DRAWINGS

Other features and advantages of the present disclosure will become apparent in the following detailed description of the embodiments and variation with reference to the accompanying drawings, of which.

DETAILED DESCRIPTION

Figure 1:
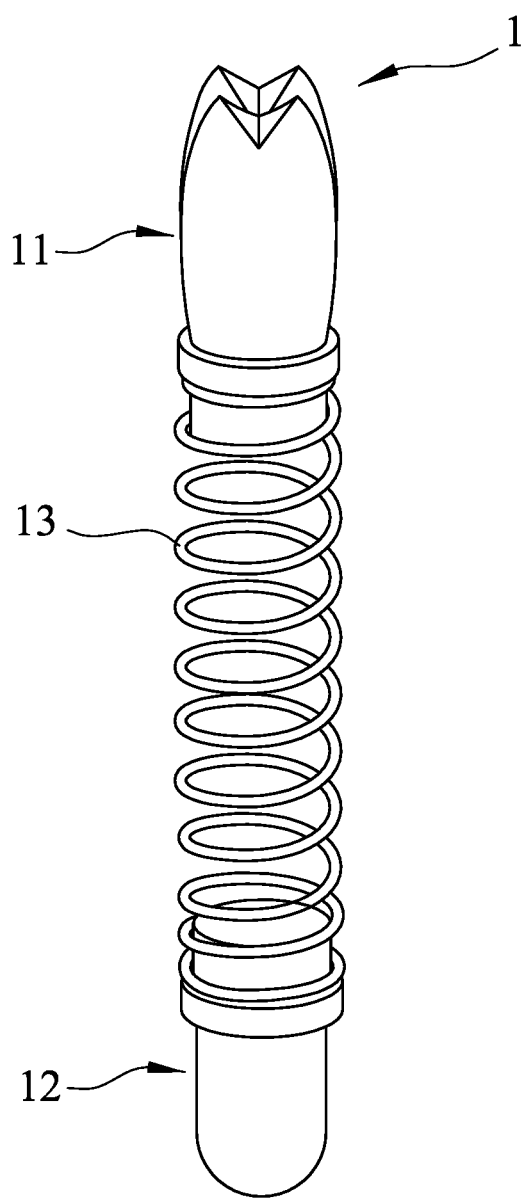
FIG. 1 is a perspective view of a conventional spring probe.

Before the disclosure is described in further detail with reference to the accompanying embodiments and variation, it should be noted herein that like elements are denoted by the same reference numerals throughout the disclosure.

Figure 2:
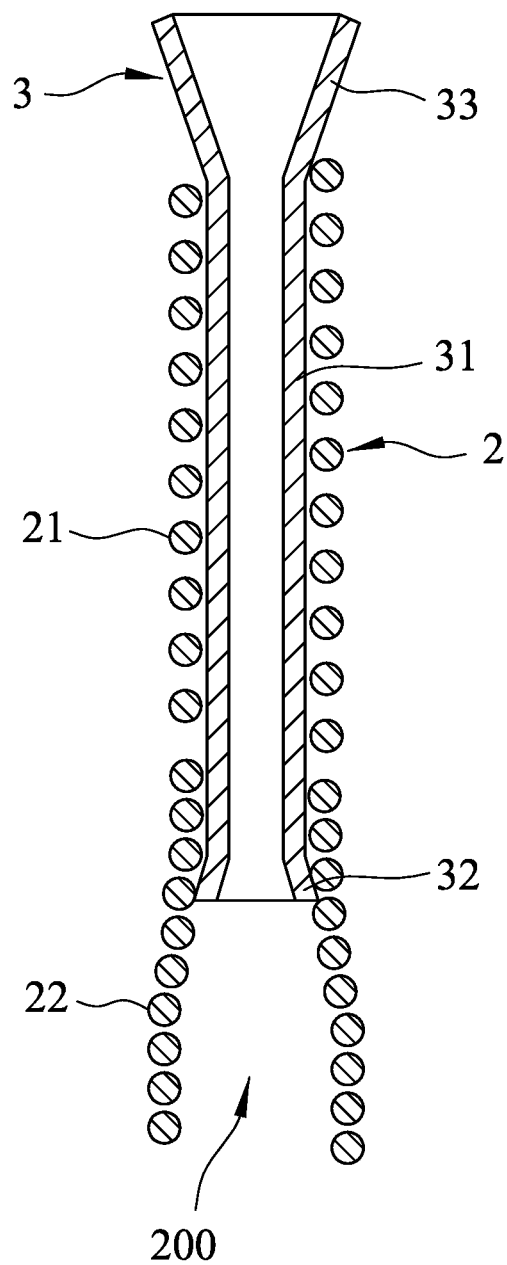
FIG. 2 is a schematic cross-sectional view of a first embodiment of a two-piece spring probe according to the present disclosure.
Figure 4:
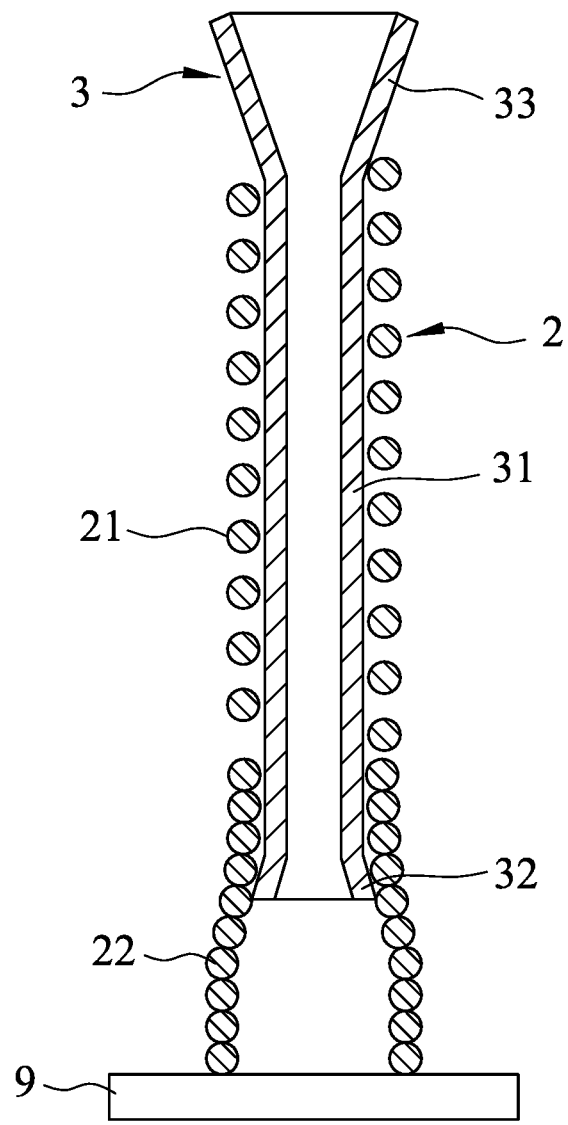
FIG. 4 is a schematic cross-sectional view showing the first embodiment in contact with an object to be tested.

Referring to FIGS. 2 and 4, a first embodiment of a two-piece spring probe according to the present disclosure in electrical contact with a piece of testing equipment (not shown) is used for probing an object 9 to be tested. The object 9 may be a sheet material. The two-piece spring probe includes a coiled compression spring 2 that has a non-uniform outer diameter and that is used to electrically contact the object 9, and a conductive element 3 that is directly connected to the coiled compression spring 2 and in electrical contact with the testing equipment. The coiled compression spring 2 defines a receiving space 200 therein. The conductive element 3 partially extends into the receiving space 200. The coiled compression spring 2 is retained on the conductive element 3 by means of deformation of the conductive element 3. In this embodiment, the conductive element 3 is a conductive tube.

The coiled compression spring 2 is made of a conductive material, has a resilient segment 21 and a contacting segment 22 connected to the resilient segment 21, and is used to contact the object 9. The contacting segment 22 of the coiled compression spring 2 has an outer diameter larger than an outer diameter of the resilient segment 21. The conductive element 3 has a straight segment 31, an enlarged deformation end segment 32, and an enlarged positioning end segment 33. The straight segment 31 is surrounded by the resilient segment 21 of the coiled compression spring 2. The enlarged deformation end segment 32 extends from the straight segment 31 along an inner surface of the contacting segment 22 to contact the coiled compression spring 2, such that the coiled compression spring 2 is retained on the conductive element 3. The enlarged positioning end segment 33 extends from the straight segment 31 oppositely of the enlarged deformation end segment 32, such that the resilient segment 21 of the coiled compression spring 2 is confined between the enlarged de formation end segment 32 and the enlarged positioning end segment 33 of the conductive element 3.

In assembling the first embodiment of the two-piece spring probe, an undeformed conductive element (not shown) extends into the receiving space 200. Then, a pipe expanding process is conducted to expand two opposite ends of the undeformed conductive element to respectively form the enlarged deformation end segment 32 and the enlarged positioning end segment 33, so that the undeformed conductive element is transformed into the conductive element 3. The enlarged deformation end segment 32 of the conductive element 3 abuts against an inner surface of the coiled compression spring 2 to support the resilient segment 21 and defines the contacting segment 22 for probing the object.

Figure 3:
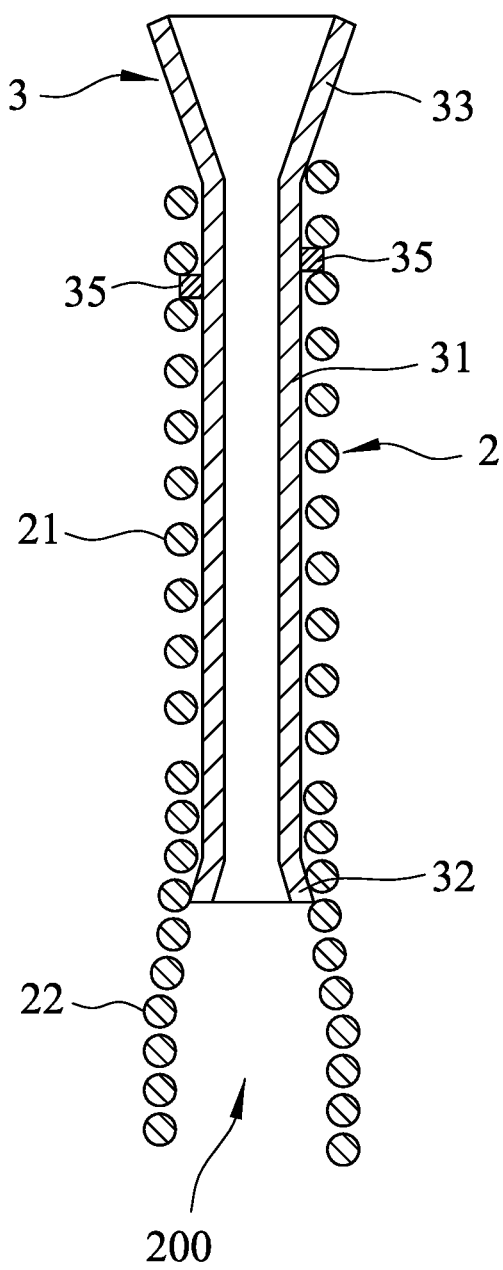
FIG. 3 is a schematic cross-sectional view of a variation of the first embodiment.

Referring to FIG. 3, a variation of the first embodiment is similar to the first embodiment with the differences described below. In the variation of the first embodiment, the conductive element 3 further has at least one positioning portions 35 extending radially and outwardly from the straight segment 31 to retain the resilient segment 21 of the coiled compression spring 2 on the straight segment 31 of the conductive element 3. It should be noted that the number and location of the at least one positioning portions 35 may be changed according to practical requirements.

Referring to FIG. 4, the contacting segment 22, when in use, is pressed against the object 9, so that the contacting segment 22 and the resilient segment 21 of the coiled compression spring 2 are compressed. It should be particularly pointed out that the enlarged deformation end segment 32 of the conductive element 3 has a length shorter than that of the contacting segment 22 of the coiled compression spring 2 when the contacting segment 22 is fully compressed. Therefore, even when the contacting segment 22 is fully compressed, the enlarged deformation end segment 32 would not be in contact with the object 9 and would not affect the probing outcome.

When the contacting segment 22 is in contact with the object 9 and fully compressed, an electrical signal generated by the object 9 passes through the contacting segment 22 and then through the conductive element 3 to reach the testing equipment, instead of passing through a spiral path provided by the coiled compression spring 2, resulting in increased efficiency of electrical signal transmission. In practical use, the two-piece spring probe is installed on the testing equipment. A distance between the contacting segment 22 of the two-piece spring probe and the object 9 is designed to ensure that the contacting segment 22 is fully compressed when probing so as to increase the electrical signal transmission efficiency.

Figure 5:
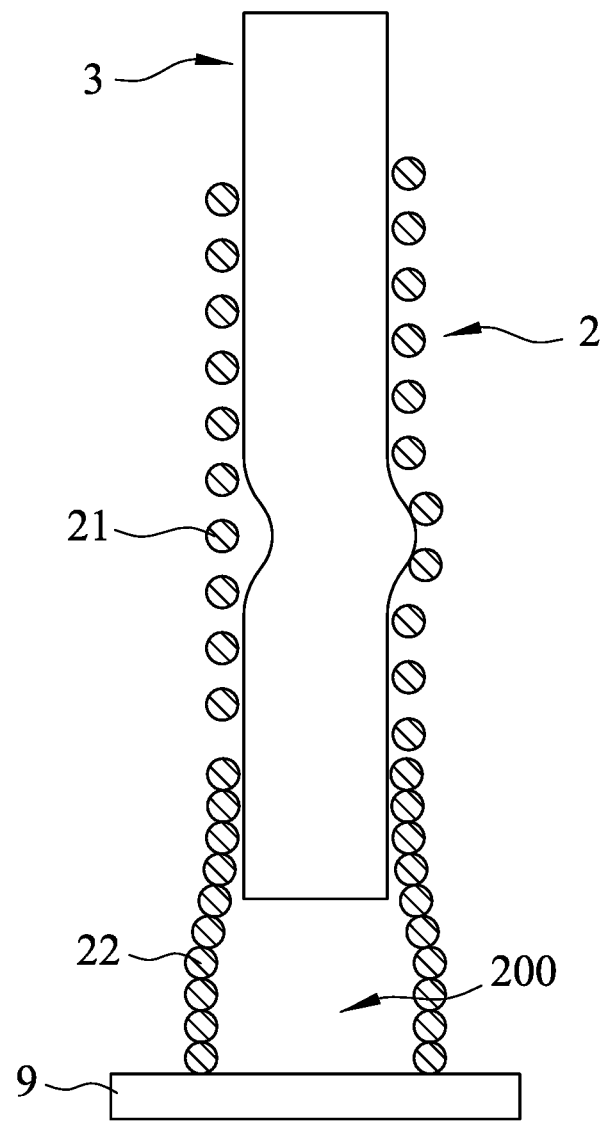
FIG. 5 is a schematic cross-sectional view showing a second embodiment of the two-piece spring probe according to the present disclosure, that is in contact with the object.

Referring to FIG. 5, a second embodiment of the two-piece spring probe is similar to the first embodiment with the differences described below. The coiled compression spring 2 has a non-uniform outer diameter, has a resilient segment 21 and a contacting segment 22, and defines a receiving space 200 therein. The conductive element 3 partially extends into the receiving space 200 of the coiled compression spring 2. At least one portion of the conductive element 3 has a shape different from that of an adjacent portion of the conductive element 3, and is in contact with the coiled compression spring 2, such that the coiled compression spring 2 is retained on the conductive element 3. To be more specific, the resilient segment 21 of the coiled compression spring 2 permits the at least one portion of the conductive element 3 to be inserted into a space between two adjacent coil turns of the resilient segment 21. It should be particularly pointed out that the conductive element 3 may be solid and rectangular-shaped. The solid conductive element 3 has sufficient mechanical strength so that the same can be subjected to deforming processes, such as bending, indenting, etc., according to practical requirements.

Figure 6:
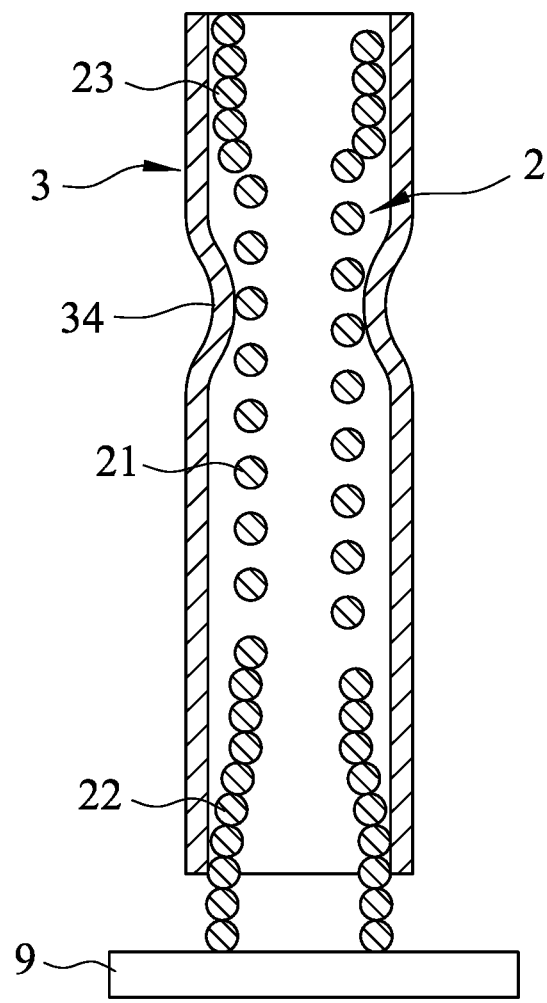
FIG. 6 is a schematic cross-sectional view of a third embodiment of the two-piece spring probe according to the present disclosure, that is in contact with the object.

Referring to FIG. 6, a third embodiment of the two-piece spring probe is similar to the first embodiment with the differences described below. In the third embodiment, the coiled compression spring 2 has the resilient segment 21, the contacting segment 22 connected to the resilient segment 21, and an expanded segment 23 connected to the resilient segment 21 oppositely of the contacting segment 22. The conductive element 3 is a conductive tube, is sleeved on the resilient segment 21 and the expanded segment 23 of the coiled compression spring 2, and has a fixing segment 34 extending radially and inwardly from the conductive element 3 so as to contact the resilient segment 21, such that the coiled compression spring 2 is confined within the conductive element 3. The expanded segment 23 of the coiled compression spring 2 has a minimum outer diameter larger than a minimum outer diameter of the resilient segment 21 and a minimum inner diameter of the fixing segment 34 of the conductive element 3. The contacting segment 22 of the coiled compression spring 2 has a minimum outer diameter larger than the minimum outer diameter of the resilient segment 21.

In assembling the third embodiment of the two-piece spring probe, an undeformed conductive tube (not shown) is sleeved on the coiled compression spring 2, followed by deforming the undeformed conductive tube to form the fixing segment 34, so that the undeformed conductive tube is transformed into the conductive element 3. The contacting segment 22 and the expanded segment 23 confine the coiled compression spring 2 within the conductive element 3.

Figure 7:
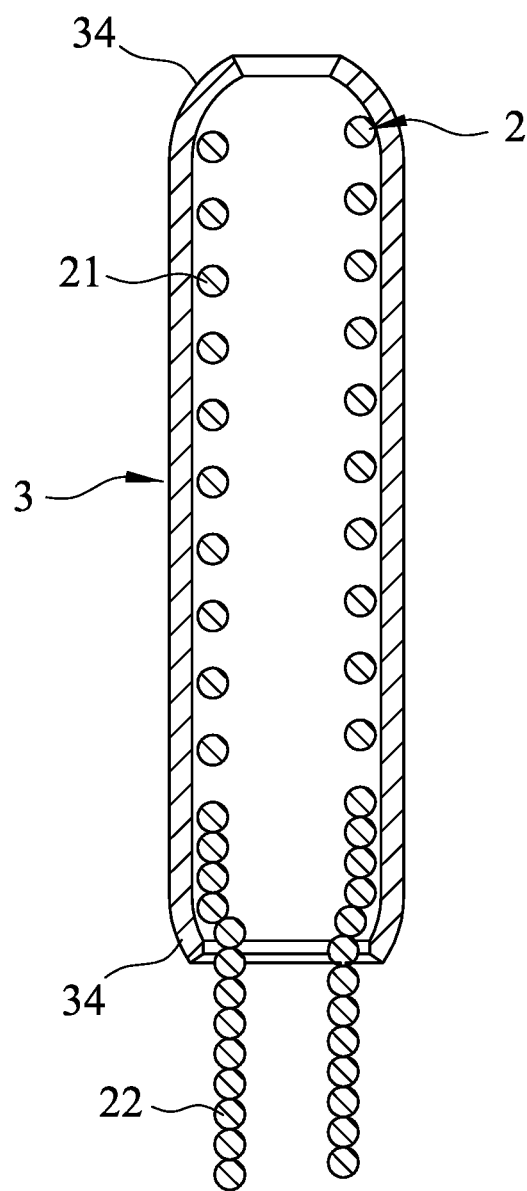
FIG. 7 is a schematic cross-sectional view showing a fourth embodiment of the two-piece spring probe according to the present disclosure.

Referring to FIG. 7, a fourth embodiment of the two-piece spring probe is similar to the third embodiment with the differences described below. In the fourth embodiment, the coiled compression spring 2 has the resilient segment 21 and the contacting segment 22 connected to the resilient segment 21. The conductive element 3 is a conductive tube, is sleeved on and contacts the resilient segment 21 of the coiled compression spring 2, and has two of the fixing segments 34 that are located at opposite ends of the conductive element 3. Each of the fixing segments 34 extends radially and inwardly from the conductive element 3. The resilient segment 21 of the coiled compression spring 2 has a minimum outer diameter larger than a minimum inner diameter of each of the fixing segments 34 and a minimum outer diameter of the contacting segment 22, such that the resilient segment 21 is confined within the conductive element 3.

In assembling the fourth embodiment of the two-piece spring probe, an undeformed conductive tube (not shown) is sleeved on the coiled compression spring 2, followed by deforming opposite ends of the undeformed conductive tube to form the fixing segments 34, so that the undeformed conductive tube is transformed into the conductive element 3. The resilient segment 21 is confined between the fixing segments 34 and within the conductive element 3.

Figure 8:
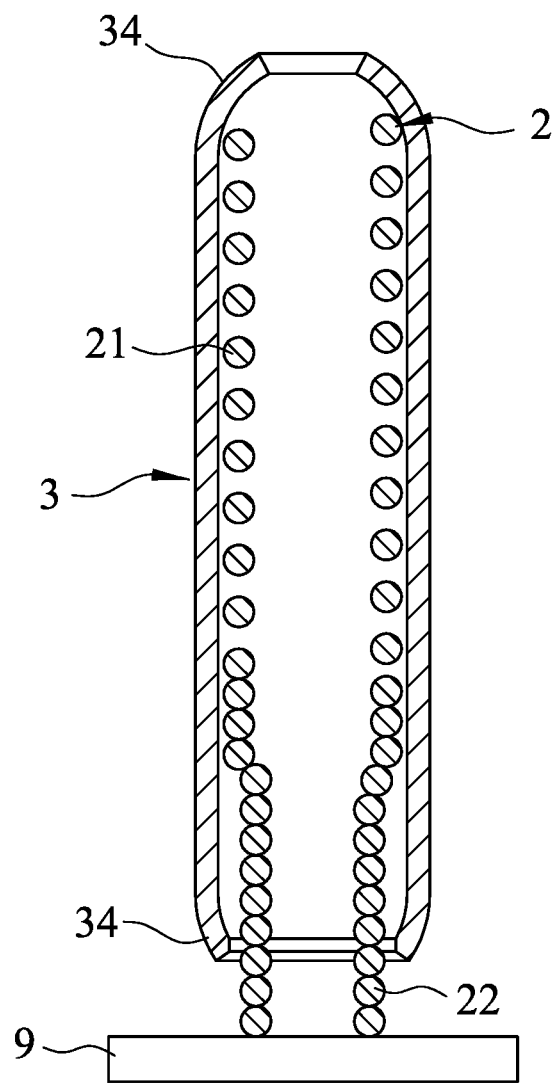
FIG. 8 is a schematic view showing the fourth embodiment in contact with an object to be tested.

Referring to FIG. 8, when the fourth embodiment of the two-piece spring probe is in use, the contacting segment 22 of the coiled compression spring 2 is in contact with the object 9 and fully compressed, and the resilient segment 21 is in contact with one of the fixing segments 34, so that the resilient segment 21 remains confined within the conductive element 3. To sum up, compared to the conventional spring probe 1, the two-piece spring probe according to the present disclosure has lower manufacturing cost and less assembly time. Moreover, when in use, the fully compressed contacting segment 22 of the coiled compression spring 2 and the conductive element 3 are capable of providing a more efficient transmission path for the electrical signal generated by the object 9. The embodiments and variation of this disclosure provide a variety of choices for different probing requirements.

While the disclosure has been described in connection with what are considered the exemplary embodiments and variation, it is understood that this disclosure is not limited to the disclosed embodiments and variation but is intended to cover various arrangements included within the spirit and scope of the broadest interpretation so as to encompass all such modifications and equivalent arrangements.

What is claimed is:

1. A two-piece spring probe adapted for electrical contact with a piece of testing equipment for probing an object to be tested, comprising:
a coiled compression spring that has a non-uniform outer diameter and that is adapted to electrically contact the object; and
a conductive element that is directly connected to said coiled compression spring and that is adapted for electrical contact with the testing equipment,
wherein said coiled compression spring defines a receiving space therein, and has a resilient segment and a contacting segment connected to said resilient segment and adapted to contact the object, said conductive element partially extending into the receiving space and having a straight segment that is surrounded by said resilient segment of said coiled compression spring, and an enlarged deformation end segment that extends from said straight segment to contact said coiled compression spring, such that said coiled compression spring is retained on said conductive element, and
wherein said conductive element further has at least one positioning portion that extends radially and outwardly from said straight segment to retain said resilient segment of said coiled compression spring on said straight segment of said conductive element.

2. The two-piece spring probe as claimed in claim 1, wherein said conductive element further has an enlarged positioning end segment that extends from said straight segment oppositely of said enlarged deformation end segment, such that said resilient segment of said coiled compression spring is confined between said enlarged deformation end segment and said enlarged positioning end segment of said conductive element.

3. The two-piece spring probe as claimed in claim 1, wherein said enlarged deformation end segment of said conductive element has a length shorter than that of said contacting segment of said coiled compression spring when said contacting segment is fully compressed.

4. The two-piece spring probe as claimed in claim 1, wherein said contacting segment of said coiled compression spring has an outer diameter larger than an outer diameter of said resilient segment.

5. A two-piece spring probe adapted for electrical contact with a piece of testing equipment for probing an object to be tested, comprising:
a coiled compression spring that has a non-uniform outer diameter and that is adapted to electrically contact the object; and
a conductive element that is directly connected to said coiled compression spring and that is adapted for electrical contact with the testing equipment,
wherein said coiled compression spring has a resilient segment and a contacting segment connected to said resilient segment and adapted to electrically contact the object, said conductive element being a conductive tube that is sleeved on said resilient segment of said coiled compression spring, and that has at least one fixing segment that extends radially and inwardly from said conductive element to contact said resilient segment, such that said coiled compression spring is confined within said conductive element.

6. The two-piece spring probe as claimed in claim 5, wherein said coiled compression spring further has an expanded segment that is connected to said resilient segment oppositely of said contacting segment, said expanded segment having a minimum outer diameter larger than a minimum outer diameter of said resilient segment and a minimum inner diameter of said at least one fixing segment of the conductive element.

7. The two-piece spring probe as claimed in claim 5, wherein said contacting segment of said coiled compression spring has a minimum outer diameter larger than a minimum outer diameter of said resilient segment.

* * * * *